April 19, 1960 J. L. BOYER ET AL 2,933,662

SEMICONDUCTOR RECTIFIER DEVICE

Filed Jan. 14, 1954 2 Sheets-Sheet 1

INVENTORS
John L. Boyer &
August P. Colaiaco.
BY O.B. Buchanan
ATTORNEY

April 19, 1960 J. L. BOYER ET AL 2,933,662

SEMICONDUCTOR RECTIFIER DEVICE

Filed Jan. 14, 1954 2 Sheets-Sheet 2

2,933,662

SEMICONDUCTOR RECTIFIER DEVICE

John L. Boyer and August P. Colaiaco, Pittsburgh, Pa., assignors to Westinghouse Electric Corporation, East Pittsburgh, Pa., a corporation of Pennsylvania Application January 14, 1954, Serial No. 404,086

22 Claims. (Cl. 317—234)

The present invention relates to semiconductor rectifier devices and, more particularly, to a power rectifier of the P–N junction type.

Semiconductor materials suitable for use in rectifiers, such as germanium and silicon, may be of either of two conductivity types. N-type material is characterized by an excess of electrons and conduction takes place because of the presence of these excess electrons. P-type material is characterized by a deficiency of electrons in the crystal structure of the material, resulting in so-called holes in the valence bonds between adjacent atoms, and conduction takes place by means of an apparent movement of these holes, which act like positive charges. Semiconductor materials of either of these conductivity types can be produced by adding very small amounts of certain impurities to the pure material. These impurities may be donor impurities which contribute excess electrons, resulting in N-type material, or they may be acceptor impurities which lack electrons to complete the valence bonds, resulting in P-type material. These materials have rectifying properties and, in particular, if a body of semiconductor material is made having adjoining zones of N-type and P-type material, the junction between these zones acts as a rectifying layer or barrier, which has low impedance to current flow from the P-type to the N-type material but very high impedance to current flow from the N-type to the P-type material.

These P–N junction rectifiers have very desirable characteristics, since they are capable of withstanding relatively high reverse voltages and can carry high current densities in the forward direction with good efficiency. These devices, therefore, are suitable for use as power rectifiers and can handle relatively large amounts of power if the rectifying junction is made of sufficient area.

In making large-area P–N junction rectifiers for practical use, however, certain difficulties are encountered. The semiconductor material must be made as thin as possible, to keep the forward resistance low, but both germanium and silicon are brittle materials, and when cut into thin wafers of large area as compared to the thickness, the wafers are extremely fragile and are easily broken. It is necessary, therefore, to design the rectifier in such a manner that the semiconductor material is adequately supported and protected from being subjected to any appreciable mechanical stresses, in order to prevent breakage of the material.

It is also necessary to provide for the best possible heat transfer from the semiconductor material to prevent excessive temperature rise. These materials, especially germanium, have quite definite temperature limits which must not be exceeded, since if the material gets too hot, its reverse impedance is rapidly lowered, resulting in large leakage currents and damage to the rectifier. The semiconductor material is heated during operation by the losses generated in it by the load current and the reverse leakage current. Since these losses are in part a function of the load current, the heating and the temperature rise of the rectifier limit the maximum rating. It is necessary, therefore, to provide for the best possible heat transfer and cooling of the rectifier, to obtain as high a rating as possible without exceeding the maximum permissible temperature.

Semiconductor materials are also very sensitive to moisture, and the presence of even a small amount of moisture close to the rectifying junction greatly increases the reverse leakage current, resulting in greatly increased heating and damage to the rectifier. The rectifier must be very well protected against moisture, therefore, to obtain good performance and long life. Thus, the design of a practical semiconductor power rectifier involves numerous difficult problems, because of the necessity of protecting the fragile material against breakage, the necessity of effective cooling, and the requirement of protection against moisture.

The principal object of the present invention is to provide a semiconductor rectifier device in which the semiconductor material is supported in such a manner that it is not subjected to appreciable mechanical stresses, and so that heat generated in the semiconductor can readily be conducted away.

Another object of the invention is to provide a semiconductor rectifier device which is hermetically sealed to protect the semiconductor material against moisture.

A further object of the invention is to provide a semiconductor rectifier device in which the semiconductor material is supported in a manner which permits good heat transfer from the material, and in which cooling means are provided to remove the heat and permit high ratings without excessive temperatures of the semiconductor material.

Still another object of the invention is to provide a hermetically sealed semiconductor rectifier device in which the semiconductor material is protected from mechanical stresses and in which cooling means are provided for preventing excessive temperatures of the material.

Other objects and advantages of the invention will be apparent from the following detailed description, taken in connection with the accompanying drawings, in which.

Figures 1, 2, 3:
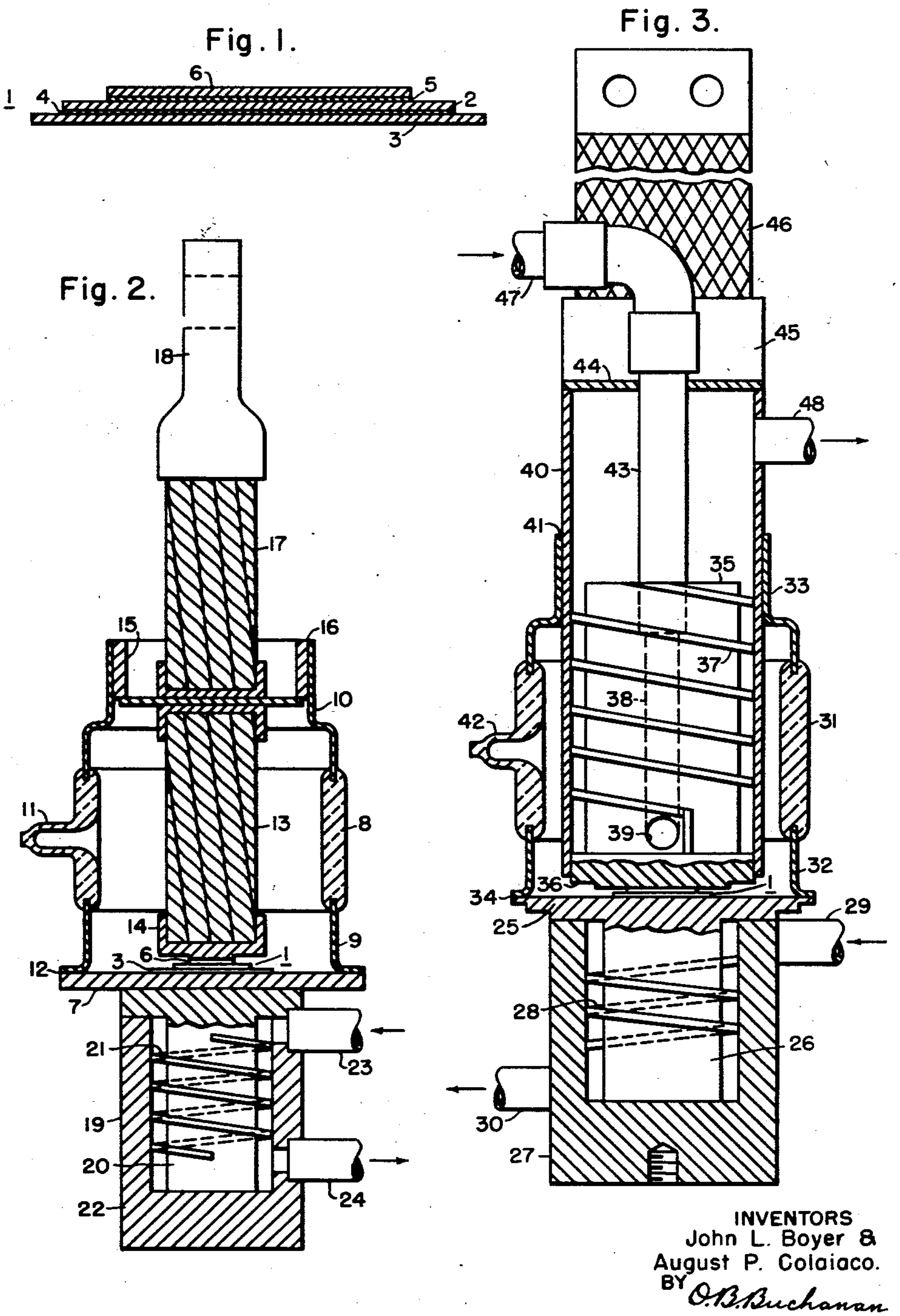
Figure 1 is a transverse sectional view of a semiconductor rectifier junction-element embodying the invention.
Fig. 2 is a vertical sectional view of a water-cooled, sealed rectifier unit.
Fig. 3 is a similar view of a modified form of water-cooled rectifier unit.

As previously indicated, a rectifier of the P–N junction type consists essentially of a body of semiconductor material which incorporates a junction between zones of P-type and N-type material. In the practical construction of such a rectifier, the semiconductor must be made as thin as possible, so that the resistance in the forward direction will be low, and its area must be made relatively large to obtain high current ratings for rectifying substantial amounts of power. The resulting semiconductor body, therefore, is a thin wafer which is very fragile, since both germanium and silicon, which are the preferred semiconductor materials, are quite brittle. The thin wafer of semiconductor material must be mounted between metal plates for mechanical support and electrical contact, and the plates must be joined to the semiconductor in a manner which will provide joints of good thermal and electrical conductivity. The most desirable material for such plates would, of course, be copper because of its high thermal and electrical conductivity, but the coefficient of thermal expansion of copper is quite high as compared to that of the semiconductor materials. If a copper plate were soldered or otherwise joined to the semiconductor, therefore, the differential expansion upon heating of the rectifier in service, or during manufacture, would cause large stresses which would break or shatter the fragile semiconductor material.

The provision of a suitable material for the supporting plates is an important feature of the present invention. The selection of a proper material is not a simple matter. The thermal expansion of the plate material must be close to that of silicon and germanium, but the plate must also have good electrical and thermal conductivity. The thermal conductivity is especially important, since in a power rectifier the losses result in the generation of a relatively large amount of heat in a small volume of semiconductor material, and this heat must be rapidly conducted away in order to keep the temperature of the material within the permissible limits. The supporting plate which is joined to the semiconductor material, therefore, must have good thermal conductivity in order to permit relatively high currents to be carried without overheating the rectifier. This requirement of good thermal conductivity makes it impractical to utilize materials such as the iron-nickel-cobalt alloys used in making glass-to-metal seals. These alloys have cofficients of thermal expansion in the necessary range, but their thermal conductivity is very poor and would cause the rectifier to overheat unless the current is limited to very low magnitudes.

These requirements of good thermal conductivity and of thermal expansion close to that of germanium and silicon make the provision of a suitable material for the supporting plates a difficult problem. We have found, however, that molybdenum meets these exacting requirements, since its coefficient of thermal expansion is sufficiently close to those of germanium and silicon to prevent breakage of the semiconductor when the rectifier is heated, and its thermal conductivity is quite high, being better than that of such materials as steel and nickel although lower than that of copper. Molybdenum is also readily available at reasonable cost and can be worked without great difficulty. These characteristics make molybdenum a very suitable material for the purpose, and it is possible to build rectifiers with molybdenum supporting plates which are capable of carrying currents of the order of hundreds of amperes when one plate is water-cooled in the manner described hereinafter.

A preferred construction for a rectifier junction-element embodying the invention is shown in Fig. 1, the thicknesses of the various elements of the device being greatly exaggerated in the drawing for clarity. The rectifier 1 consists of a body of semiconductor material 2, which may be either germanium or silicon, supported on a relatively rigid lower backing or supporting plate 3 of molybdenum. The semiconductor material 2 is in the form of a thin wafer, as described above, and it is secured to the plate 3 by a very thin layer of solder 4. The solder 4 is preferably pure tin, although a tin-lead solder, or other low-melting-point solder, might be used. The layer of solder is made as thin as possible, a thickness of the order of 2 mils or less being desirable, in order to present very little resistance to the flow of heat. The solder must be very pure and must not contain any acceptor material, such as indium, in order to obtain a purely ohmic contact.

The semiconductor material 2 is preferably N-type material, and the solder 4 may contain a small amount of antimony, or other donor impurity, such as phosphorus, if desired, which will diffuse into the semiconductor to enhance its N-type characteristics. A thin layer of indium 5 is applied on top of the semiconductor material 2. The indium 5 alloys with the semiconductor and diffuses into it, converting a portion of the semiconductor to P-type material, thus forming a P–N junction to obtain the desired rectifying characteristics. A relatively rigid upper backing or supporting plate 6 of molybdenum is placed on top of the layer of indium and is secured to the semiconductor by the indium which acts as a cementing material as well as providing the necessary P-type characteristics to the adjacent semiconductor material.

It will be understood, of course, that other materials might be used which would have the same effect and that, if desired, the conductivity types might be reversed. That is, P-type semiconductor material might be used with a layer of suitable material, such as antimony, applied to it to convert some of the material to N-type material.

The device as shown might also be inverted. That is, the indium might be applied between the bottom molybdenum plate 3 and the semiconductor 2, and the top molybdenum plate 6 might be soldered to the semiconductor. This would result in a rectifying junction of somewhat greater area, extending to the edge of the semiconductor. Other acceptor materials may, of course, be used to form the rectifying junction. Thus, when silicon is used as the semiconductor material, aluminum may desirably be used instead of indium.

It will be seen that a semiconductor rectifier device or rectifier-element is thus provided, in which a fragile flat piece of semiconductor material is supported between two metal plates, which have sufficient thermal conductivity to prevent excessive temperature rise of the semiconductor, and which are joined to it with joints of good thermal and electrical conductivity. The thermal expansivity of the molybdenum plates 3 and 6 is close enough to that of the semiconductor material so that when the device is heated, the differential expansion is quite small and the fragile semiconductor material is not subjected to appreciable mechanical stresses. The solder and indium are relatively ductile materials and have a cushioning effect which further protects the semiconductor material from undesirable stresses.

As previously explained, semiconductor materials such as germanium and silicon are quite sensitive to moisture and must be effectively protected against moisture. A sealed rectifier device is shown in Fig. 2 which provides such protection, as well as providing for effective cooling of the rectifier. The rectifier junction-element 1 itself is preferably of the construction shown in Fig. 1, and the bottom or back side of the bottom molybdenum supporting plate 3 is soldered to a relatively large copper terminal plate 7 for good heat transfer from the rectifier. The device is enclosed in an insulating, gas-tight enclosing member which preferably consists of a cylindrical glass tube 8 with metal attaching sleeves 9 and 10 at opposite ends. The sleeves 9 and 10 are fused to the glass, and are made of a suitable metal which is capable of forming a permanent, air-tight seal with the glass. An evacuating tube 11 may be formed in the glass tube 8 at one side.

The lower sleeve 9 of the gas-tight enclosure is brazed to the copper plate 7, as indicated at 12, to form a hermetic or gas-tight seal extending around the periphery of the plate 7. Inside the gas-tight enclosure, a flexible terminal-conductor 13, which may be of braided copper of suitable size to carry the desired current, is secured to the upper molybdenum supporting plate 6 of the rectifier 1, in any suitable manner, as by soldering the end of the conductor 13 in a copper cup member 14 which is soldered or otherwise attached to the molybdenum plate 6. The upper end of the flexible conductor 13 is secured to a generally cup-shaped upper closure member 15, or other spaced rigid terminal-means, which is spaced from the backing-plate 6. In the form of our invention which is shown in Fig. 2, this upper closure member 15 fits within the upper sleeve 10 of the gas-tight enclosure and is brazed to it at 16, to form a hermetic seal. The rectifier 1 is thus completely enclosed in a gas-tight enclosure, and after assembly of the device, the enclosure is evacuated through the tube 11, which is then sealed off.

The enclosure may, if desired, be filled with a dry inert gas, such as helium.

Another flexible conductor 17, similar to the conductor 13, is brazed to the outside of the closure member 15 to provide for electrical connection to the rectifier 1, and a suitable terminal device 18 of any desired type may be secured to the conductor 17.

Connection to the other side of the rectifier 1 is made through the copper plate 7. In the preferred embodiment shown in the drawing, the plate 7 is water-cooled to remove as much heat as possible from the rectifier 1, so as to permit high current ratings without exceeding the permissible temperature of the semiconductor. For this purpose, a cooling means is provided, which includes a hollow cylindrical copper member 19, closed at its lower end, and brazed or otherwise attached to the plate 7. A copper cylinder 20 extends down from the plate 7 within the member 19 and is preferably integral with the plate 7. The cylinder 20 has a helical rib 21 on its surface, which fits snugly in the member 19. The rib 21 provides a helical passage from one end to the other of the member 19; and an inlet pipe 23 and an outlet pipe 24 are secured in the wall of the member 19, communicating with this passage to permit the circulation of water, or other cooling liquid, through the passage. It will be seen that effective cooling is obtained in this way, since the heat generated in the rectifier 1 flows directly to the copper plate 7 and through the members 19 and 20 directly to the cooling water. The somewhat restricted helical passage provides a high-velocity flow of water through the device, so that good heat transfer is obtained and the heat generated in the rectifier is effectively removed or withdrawn, thus limiting the temperature.

A hermetically sealed rectifier is thus provided, in which the semiconductor material is effectively protected against moisture and against mechanical stresses. The flexible connector 13 within the sealed enclosure is an important feature of the invention, since it protects the rectifier 1 against bending stresses which might be applied to it by careless handling of the device. Thus, a water-cooled rectifier is provided, which is very well suited for power purposes, since a large-area semiconductor device can be used without risk of breakage of the semiconductor material by mechanical stresses, and without overheating because of the effective cooling, which permits large currents to be handled.

As previously indicated, the lower plate 3 of the rectifier 1, which is soldered to the plate 7 and directly cooled, may be soldered to the N-type semiconductor so that it is the negative terminal of the rectifier, or the device may be inverted, with the indium between the lower plate and the semi-conductor, so that the lower plate is the positive terminal. Either arrangement may be used, depending on the conditions of a particular installation. Thus, for example, if six rectifiers are to be connected in a conventional three-phase bridge circuit, the positive terminals of three of the rectifiers will be connected together and the negative terminals of the other three will be connected together. It will then be desirable to use three rectifiers in which the lower plate is positive and three in which it is negative, since the cooling water for each group of three can then flow in series through all three without requiring insulating water connections between them, thus simplifying the installation.

Where relatively large currents are to be carried, it may be desirable to provide water cooling on both sides of the rectifier device, and this may be done in the manner shown in Fig. 3. The rectifier 1 itself may be a device of the type shown in Fig. 1, and its lower molybdenum supporting plate 3 is soldered, or otherwise joined, to a copper plate 25 with a depending cylindrical portion 26. A relatively large hollow copper cylinder 27, closed at its lower end, fits over the cylindrical portion 26 and is brazed to the plate 25. The cylindrical portion 26 of the plate 25 is provided with a helical rib 28, forming a helical passage. Inlet and outlet tubes 29 and 30, respectively, are provided, communicating with the ends of the helical passage for the circulation of water, or other cooling liquid, therethrough so that the heat generated in the rectifier 1 and flowing to the copper plate 25 is carried away by the cooling water, thus cooling the lower side of the rectifier in the same manner as in Fig. 2.

The rectifier device 1 of Fig. 3 is enclosed in a gas-tight, insulating enclosure, which may consist of a glass tube 31 with metal attaching sleeves 32 and 33 fused in the glass as described in connection with Fig. 2. The lower attaching sleeve 32 is brazed to the top of the copper plate 25 at 34 to form a hermetic seal.

In Fig. 3, a cylindrical copper member 35 is soldered to the upper molybdenum plate 6 of the rectifier 1. The copper member 35 has a flange 36 at its lower end and a helical rib 37 extending from one end to the other. A central passage 38 extends axially of the member 35 and communicates with the helical passage formed by the rib 37, through an opening 39 near the bottom of the member 35. A copper tube 40 fits snugly over the rib 37 and flange 36, as shown, and is brazed or otherwise secured to the flange 36 with a water-tight joint. The upper end of the tube 40 extends above the gas-tight enclosure, and the upper sleeve 33 is brazed to the tube 40 at 41 to form a hermetic seal, completely enclosing the rectifier 1 in a gas-tight enclosure which may be evacuated, or filled with an inert gas, through an evacuating tube 42 which is then sealed off.

In Fig. 3, a copper tube 43 extends down through the top of the tube 40 to the member 35 and communicates with the central passage 38. The top of the tube 40 is closed by a copper plate 44 which is brazed to the tube to form a water-tight joint, the tube 43 passing through the plate 44 and being secured thereto with another water-tight brazed joint. One side of the top plate 44 may be bent up to form a terminal lug 45 at one side of the device, to which a flexible conductor 46 is secured. A flexible inlet pipe 47 is secured to the upper end of the tube 43 for the entrance of cooling water, which flows down through the pipe 43 and through passages 38 and 39 to a point which is closely adjacent to the rectifier 1, and then flows through the helical passage formed by the rib 37 and is discharged through a discharge pipe 48 in the wall of the tube 40. The inlet and discharge pipes 47 and 48 are preferably made sufficiently flexible to prevent applying any substantial mechanical bending stresses to the rectifier 1, and the flexible conductor 46 prevents the external electrical connecting means, such as a bus bar, from applying any substantial stresses to the device. Thus the rectifier shown in Fig. 3 has the same advantages as that of Fig. 2, but provides more effective cooling since both sides of the rectifier are water-cooled.

It will be noted that, in the constructions of both Figs. 2 and 3, heat generated in the rectifier 1 flows directly into relatively large masses of copper and then to the cooling water. The advantage of this construction is that the copper cylinders 20, 26 and 35 have large surface areas in contact with the cooling water. The heat distributes itself throughout the mass of copper and thus a large area is provided for heat transfer to the water. The temperature drop between the copper and the water is kept to a minimum in this way, and very effective cooling of the rectifier is provided.

Figure 4:
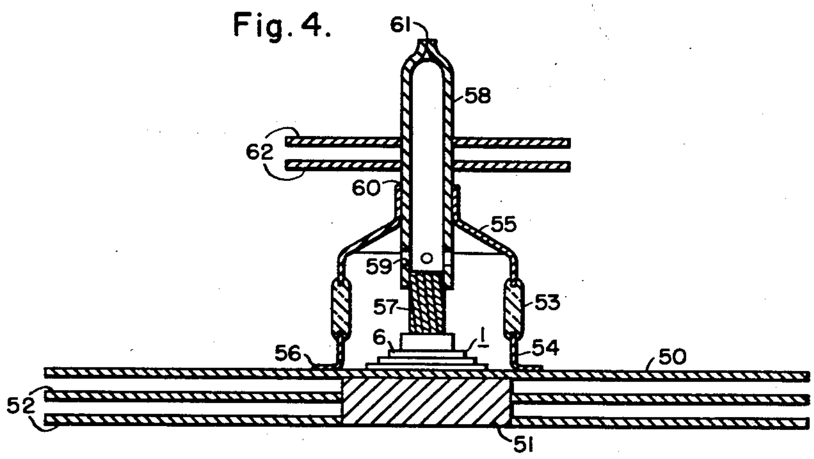
Fig. 4 is a vertical sectional view of a sealed, air-cooled rectifier.

In some cases, where the currents involved are not too large, water-cooling may not be necessary, and air cooling can be relied upon. Fig. 4 shows a hermetically sealed, air-cooled rectifier unit which is suitable in such cases. In this device, the rectifier 1 may be as shown in Fig. 1 and described above, and is soldered to a copper plate 50 of relatively large area, to which the heat generated in the rectifier is conducted. A copper terminal block 51 is brazed or soldered to the plate 50 and fins 52 are attached to the block 51. The heat generated in the rectifier 1 flows to the plate 50 and to the relatively massive block 51, which has high thermal capacity, and is radiated to the air by the fins 52 and plate 50.

In Fig. 4, the rectifier 1 is hermetically sealed in a gas-tight enclosure which may comprise a glass tube 53 with metal sleeves 54 and 55, as previously described. The lower sleeve 54 is brazed to the plate 50 at 56 to form a hermetic seal. A flexible conductor 57, which may be of braided copper, is joined to the upper supporting plate 6 of the rectifier 1, and at its upper end it is joined to a tubular copper terminal member 58, which has a plurality of radial openings 59 near its lower end within the gas-tight enclosure. The upper sleeve 55 is brazed to an intermediate portion of the tubular terminal member 58 at 60, to form a hermetic seal completing the gas-tight enclosure. The enclosure may be evacuated through the hollow terminal member 58 and, if desired, filled with an inert gas, and the upper end of the terminal member 58 is then pinched together and brazed at 61 to complete the seal. This construction avoids the necessity for an evacuating tube in the glass enclosure 53. It will be seen that this device is generally similar to that of Fig. 2, and has the same advantages, but that it relies on air-cooling to carry away the heat generated in the rectifier, by means of the fins 50 and 52. If desired, additional fins 62 may be provided on the terminal member 58 to further assist in dissipating the heat.

Figure 5:
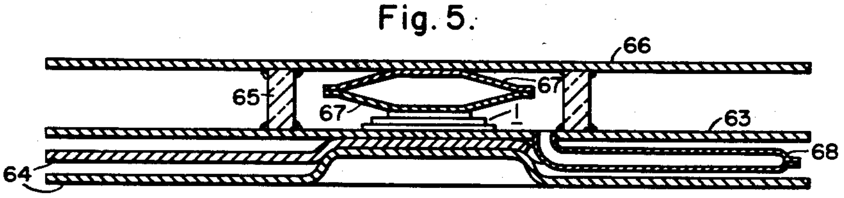
Fig. 5 is a similar view of another embodiment of the invention.

Fig. 5 shows another form of air-cooled rectifier device, which may be desirable in some cases. In this construction, the rectifier 1 is soldered to a large copper plate 63, and additional copper plates or fins 64 are soldered or brazed to the bottom of the plate 63 to assist in dissipating the heat. In this embodiment of the invention, the gas-tight enclosure is shown as consisting of a porcelain ring or tube 65, which is hermetically sealed to the plate 63 by soldering the plate to a metallic glaze on the porcelain. The top of the enclosure is closed by another copper plate 66, which is similarly sealed to the top of the porcelain tube 65. Electrical and thermal connection between the rectifier 1 and the copper plate 66 is provided by a resilient member consisting of two cupped diaphragms 67, which are joined at their edges and which may have radial saw cuts to increase their flexibility. This resilient member is preferably soldered to the upper molybdenum plate 6 of the rectifier 1, and its upper side may be secured to the plate 66 in any desired manner, or it may be compressed sufficiently to form a good thermal and electrical contact by pressure alone. The gas-tight enclosure may be evacuated by means of a tube 68 disposed in a radial slot in one of the fins 64 and extending through the plate 63 to the interior of the porcelain tube 65. This arrangement provides for evacuating the enclosure without requiring any extra space for the evacuating tube.

It will be seen that the construction shown in Fig. 5 has the same advantages as those previously described in protecting the fragile semiconductor material from mechanical stresses, and hermetically sealing it for protection against moisture. Cooling is provided by the large fins which dissipate the heat from the rectifier. This arrangement has the further advantage of providing flat upper and lower surfaces so that a plurality of these devices can readily be stacked in a series arrangement for higher voltages.

It should now be apparent that a semi-conductor rectifier device has been provided, which is suitable for practical use for rectifying relatively large amounts of power, since the construction provides for good heat transfer from the semiconductor material and for dissipation of the heat by either air-cooling or water-cooling, and it also provides protection for the rectifier against moisture and against mechanical stresses.

It will be understood that the invention is capable of various modifications and embodiments, and is not limited to the specific details of construction shown in the drawing for the purpose of illustration.

We claim as our invention:

1. A semiconductor rectifier device of the P–N junction type, comprising a wafer of semiconductor material, a first metal plate having significantly higher thermal conductivity compared to the semiconductor material and having a coefficient of thermal expansion close to that of the semiconductor material, a thin layer of solder securing said first plate to one side of the semi-conductor wafer with a point of good thermal and electrical conductivity, a second metal plate having significantly higher thermal conductivity compared to the semiconductor material and having a coefficient of thermal expansion close to that of the semiconductor material, said second plate being disposed on the opposite side of the semiconductor wafer, and a layer of thermally and electrically conductive material joining the second plate to the semiconductor wafer over a large area of the semiconductor wafer, said layer of thermally and electrically conductive material being of a type which is adapted to alloy with the semiconductor material to form a rectifying junction therein.

2. A semiconductor rectifier device comprising a molybdenum plate, a body of semiconductor material selected from the class consisting of germanium and silicon, the area of said body of semiconductor material being substantially equivalent to the area of said plate, said semiconductor material being of one conductivity type, solder means joining one side of the semiconductor body to said molybdenum plate over a large area compared to the area of said plate with a joint of good thermal and electrical conductivity, and a layer of conductive material on the opposite side of the semiconductor body, said last-mentioned material being of a type which is adapted to alloy with the adjacent semiconductor material to convert a portion of the semiconductor material to the opposite conductivity type to provide a rectifying junction.

3. A semiconductor rectifier device comprising a first molybdenum plate, a body of semiconductor material selected from the class consisting of germanium and silicon, said body of semiconductor material being of substantially the same area though smaller than said first molybdenum plate, said semiconductor material being of one conductivity type, a thin layer of solder joining one side of the semiconductor body to said first plate over a large area with a joint of good thermal and electrical conductivity, a layer of conductive material on the opposite side of the semiconductor body, said conductive material being of a type which is adapted to alloy with the adjacent semiconductor material to convert a portion of the semiconductor material to the opposite conductivity type to provide a rectifying junction, and a second molybdenum plate disposed on said opposite side of the semiconductor body and joined thereto over a large area by said conductive material.

4. A semiconductor rectifier device comprising a first molybdenum plate, a body of semiconductor material selected from the class consisting of germanium and silicon, said body of semiconductor material being of large area though smaller than said first molybdenum plate, said semiconductor material being of N conductivity type, a thin layer of solder joining one side of the semiconductor body to said first plate over a large area with a joint of good thermal and electrical conductivity, a layer of indium on the opposite side of the semiconductor body, and a second molybdenum plate disposed on said opposite side of the semiconductor body and joined thereto over a large area by said layer of indium.

5. A rectifier device of the P–N junction type comprising a body of relatively fragile, substantially rigid semiconductor material having adjoining zones of opposite conductivity type to provide a rectifying junction, metal supporting plates of material having good thermal conductivity compared to the semiconductor material and having a coefficient of thermal expansion close to that of the semiconductor material, said plates being joined to opposite sides of the semiconductor body with joints of good thermal and electrical conductivity, conducting members secured to each of said supporting plates, and insulating gas-tight enclosing means enclosing said device and joined to each of the conducting members with a hermetic seal.

6. A rectifier device of the P–N junction type comprising a body of relatively fragile, substantially rigid semiconductor material having adjoining zones of opposite conductivity type to provide a rectifying junction, metal supporting plates joined to opposite sides of the semiconductor body with joints of good thermal and electrical conductivity, conducting members secured to each of said supporting plates, and insulating gas-tight enclosing means enclosing said device and joined to each of the conducting members with a hermetic seal, at least one of the conducting members including a flexible portion within the enclosing means.

7. A rectifier device of the P–N junction type comprising a body of relatively fragile, substantially rigid semiconductor material having adjoining zones of opposite conductivity type to provide a rectifying junction, metal supporting plates joined to opposite sides of the semiconductor body with joints of good thermal and electrical conductivity, a conducting member secured to one of said supporting plates, insulating gas-tight enclosing means hermetically joined to said conducting member and enclosing the rectifier device, a flexible conductor disposed in conductive relation to the other of said supporting plates within the enclosing means, and conducting means hermetically joined to the enclosing means and in electrical contact with the flexible conductor.

8. A rectifier device of the P–N junction type comprising a body of relatively fragile, substantially rigid semiconductor material having adjoining zones of opposite conductivity type to provide a rectifying junction, metal supporting plates of material having good thermal conductivity compared to the semiconductor material and having a coefficient of thermal expansion close to that of the semiconductor material, said plates being joined to opposite sides of the semiconductor body with joints of good thermal and electrical conductivity, conducting members secured to each of said supporting plates, and means for cooling at least one of the conducting members.

9. A rectifier device of the P–N junction type comprising a body of semiconductor material having adjoining zones of opposite conductivity type to provide a rectifying junction, metal supporting plates of material having good thermal conductivity compared to the semiconductor material and having a coefficient of thermal expansion close to that of the semiconductor material, said plates being joined to opposite sides of the semiconductor body with joints of good thermal and electrical conductivity, conducting members secured to each of said supporting plates, insulating gas-tight enclosing means enclosing said device and hermetically joined to each of the conducting members, and means for cooling at least one of the conducting members.

10. A rectifier device of the P–N junction type comprising a body of semiconductor material having adjoining zones of opposite conductivity type to provide a rectifying junction, metal supporting plates of material having good thermal conductivity compared to the semiconductor material and having a coefficient of thermal expansion close to that of the semiconductor material, said plates being joined to opposite sides of the semiconductor body with joints of good thermal and electrical conductivity, conducting members secured to each of said supporting plates, insulating gas-tight enclosing means enclosing said device and hermetically joined to each of the conducting members, and means for circulating a cooling liquid in heat exchange relation with at least one of the conducting members.

11. A rectifier device of the P–N junction type comprising a body of semiconductor material having adjoining zones of opposite conductivity type to provide a rectifying junction, metal supporting plates joined to opposite sides of the semiconductor body with joints of good thermal and electrical conductivity, conducting members secured to each of said supporting plates, insulating gas-tight enclosing means enclosing said device and hermetically joined to each of the conducting members, at least one of the conducting members including heat exchange means, and means for circulating a cooling liquid through said heat exchange means.

12. A rectifier device of the P–N junction type comprising a body of semiconductor material having adjoining zones of opposite conductivity type to provide a rectifying junction, metal supporting plates joined to opposite sides of the semiconductor body with joints of good thermal and electrical conductivity, a conducting member secured to one of said supporting plates, means for circulating a cooling liquid in heat exchange relation with the conducting member, insulating gas-tight enclosing means hermetically joined to said conducting member and enclosing the rectifier device, a flexible conductor disposed in conductive relation to the other of said supporting plates within the enclosing means, and conducting means hermetically joined to the enclosing means and in electrical contact with the flexible conductor.

13. A rectifier device of the P–N junction type comprising a body of semiconductor material having adjoining zones of opposite conductivity type to provide a rectifying junction, metal supporting plates joined to opposite sides of the semiconductor body with joints of good thermal and electrical conductivity, a conducting member secured to one of said supporting plates, said conducting member having a helical passage therein, means for circulating a cooling liquid through said passage, insulating gas-tight enclosing means hermetically joined to said conducting member and enclosing the rectifier device, a flexible conductor disposed in conductive relation to the other of said supporting plates within the enclosing means, and conducting means hermetically joined to the enclosing means and in electrical contact with the flexible conductor.

14. A rectifier device of the P–N junction type comprising a body of semiconductor material having adjoining zones of opposite conductivity type to provide a rectifying junction, metal supporting plates joined to opposite sides of the semiconductor body with joints of good thermal and electrical conductivity, a first conducting member secured to one of said supporting plates, means for circulating a cooling liquid in heat exchange relation with said first conducting member, insulating gas-tight enclosing means enclosing the rectifier device and hermetically joined to the first conducting member, a second conducting member secured to the other of the supporting plates within the enclosing means, the second conducting member extending out of the enclosing means and being hermetically joined thereto, and means for circulating a cooling liquid in heat exchange relation with the second conducting member.

15. A rectifier device of the P–N junction type comprising a body of semiconductor material having adjoining zones of opposite conductivity type to provide a rectifying junction, metal supporting plates joined to opposite sides of the semiconductor body with joints of good thermal and electrical conductivity, a first conducting member secured to one of said supporting plates, means for circulating a cooling liquid in heat exchange relation with said first conducting member, insulating gas-tight enclosing means enclosing the rectifier device and hermetically joined to the first conducting member, a second conducting member secured to the other of the supporting plates within the enclosing means, the second conducting member extending out of the enclosing means and being hermetically joined thereto, the second conducting member having a passage therein extending close to the end of the conducting member within the enclosing means, and means for circulating a cooling liquid through said passage.

16. A rectifier device of the P–N junction type comprising a body of relatively fragile, substantially rigid semiconductor material having adjoining zones of opposite conductivity type to provide a rectifying junction, metal supporting plates of material having good thermal conductivity compared to the semiconductor material and having a coefficient of thermal expansion close to that of the semiconductor material, said plates being joined to opposite sides of the semiconductor body with joints of good thermal and electrical conductivity, conducting members disposed in electrical and thermal conducting relation to each of said supporting plates, and insulating gas-tight enclosing means enclosing said device and joined to each of the conducting members with a hermetic seal, at least one of the conducting members having cooling fins thereon.

17. A rectifier device of the P–N junction type comprising a body of semiconductor material having adjoining zones of opposite conductivity type to provide a rectifying junction, metal supporting plates joined to opposite sides of the semiconductor body with joints of good thermal and electrical conductivity, a first conducting member secured to one of said supporting plates, insulating gas-tight enclosing means enclosing said device and joined to the first conducting member with a hermetic seal, a flexible conductor joined to the other of the supporting plates within the enclosing means, and a second conducting member secured to the flexible conductor, the second conducting member extending out of the enclosing means and being hermetically sealed thereto, and said first and second conducting members having cooling fins thereon.

18. A rectifier device of the P–N junction type comprising a body of semiconductor material having adjoining zones of opposite conductivity type to provide a rectifying junction, metal supporting plates joined to opposite sides of the semiconductor body with joints of good thermal and electrical conductivity, a first conducting member secured to one of said supporting plates, said conducting member having cooling fins thereon disposed to provide a substantially flat surface, insulating, gas-tight enclosing means enclosing said device and joined to the conducting member with a hermetic seal, a second conducting member closing the enclosing means and hermetically sealed thereto, said second conducting member providing a substantially flat surface of relatively large area, and a resilient conducting member within the enclosing means disposed in electrical and thermal conducting relation to the other of said supporting plates and to the second conducting member.

19. A rectifier device of the P–N junction type comprising a body of relatively fragile, substantially rigid semiconductor material having adjoining zones of opposite conductivity type to provide a rectifying junction, metal supporting plates of material having good thermal conductivity compared to the semiconductor material and having a coefficient of thermal expansion close to that of the semiconductor material and having electrical resistivity close to that of molybdenum, said plates being joined to opposite sides of the semiconductor body over a substantial area compared to the area of the semiconductor body with joints of good thermal and electrical conductivity, means for hermetically sealing said device in a gas-tight enclosure, and means for effecting electrical connection through said enclosure to said plates.

20. In a semiconductor device, in combination, a brittle wafer of a semiconductor material having a rectifying junction formed therein, the wafer being of substantial area and being relatively thin, a first molybdenum plate of an area at least as large as the area of the wafer soldered to one face of the wafer, a second molybdenum plate of an area less than the area of the wafer soldered to the other face of the wafer, the molybdenum plates forming electrodes to the wafer, the soldered joints providing good thermal and electrical conductivity between the wafer and the plates, the molybdenum plate having a better thermal conductivity than that of the wafer, the first molybdenum plate thereby being capable of efficiently removing heat from the wafer, the coefficient of thermal expansion of the wafer being substantially similar to the coefficient of thermal expansion of the molybdenum plates over the temperature range to which the semiconductor device is to be subjected in use.

21. In a semiconductor device, in combination, a brittle wafer of a semiconductor material selected from the group consisting of silicon and germanium having a rectifying junction formed therein, the wafer being of substantial area and being relatively thin, a first molybdenum plate of an area at least as large as the area of the wafer soldered to one face of the wafer, a second molybdenum plate of an area less than the area of the wafer soldered to the other face of the wafer, the molybdenum plates forming electrodes to the wafer, the soldered joints providing good thermal and electrical conductivity between the wafer and the plates, the molybdenum plates having better thermal conductivity than the wafer, the first molybdenum plate thereby providing for efficient removal of heat from the wafer, the coefficient of thermal expansion of the wafer being substantially similar to the coefficient of thermal expansion of the molybdenum plates over the temperature range to which the semiconductor device is to be subjected in use.

22. In a semiconductor device, in combination, a brittle wafer of a semiconductor material selected from the group consisting of silicon and germanium, the wafer having a rectifying junction therein, the brittle wafer being of substantial area and being relatively thin, a first plate of an area at least as large as the wafer soldered to one face of the wafer, a second plate of an area less than the area of the wafer soldered to the other surface of the wafer, the plates being composed of a metal of a coefficient of thermal expansion similar to that of molybdenum and closely similar to the coefficient of the wafer of semiconductor material, the thermal conductivity of the plate material being at least as high as that of the wafer material, the plates forming electrodes to the wafer, at least the larger plate being connected to a heat sink so that heat generated by the passage of electrical current through the wafer is efficiently transmitted through the soldered joint to the plate and thence to the heat sink.

References Cited in the file of this patent

UNITED STATES PATENTS

| | | |
|---|---|---|
| 1,728,537 | Geiger | Sept. 17, 1929 |
| 1,751,360 | Ruben | Mar. 18, 1930 |
| 1,905,703 | Harries | Apr. 25, 1933 |
| 2,441,603 | Storkes et al. | May 18, 1948 |
| 2,468,051 | Escoffery | Apr. 26, 1949 |
| 2,602,763 | Scaff et al. | July 8, 1952 |
| 2,662,997 | Christensen | Dec. 15, 1953 |
| 2,689,930 | Hall | Sept. 21, 1954 |
| 2,720,617 | Sardella | Oct. 11, 1955 |
| 2,730,663 | Harty | Jan. 10, 1956 |
| 2,781,480 | Mueller | Feb. 12, 1957 |
| 2,790,089 | Pelfrey | Apr. 23, 1957 |
| 2,796,563 | Ebers et al. | June 18, 1957 |
| 2,861,230 | Loup | Nov. 18, 1958 |